United States Patent [19]

Janikowski et al.

[11] Patent Number: 4,567,111

[45] Date of Patent: Jan. 28, 1986

[54] CONDUCTIVE PIGMENT-COATED SURFACES

[75] Inventors: Daniel S. Janikowski, Lake Geneva, Wis.; Ming S. Shum, Des Plaines, Ill.

[73] Assignee: UOP Inc., Des Plaines, Ill.

[21] Appl. No.: 609,926

[22] Filed: May 14, 1984

Related U.S. Application Data

[63] Continuation-in-part of Ser. No. 439,166, Nov. 4, 1982, abandoned.

[51] Int. Cl.⁴ .......................... H01B 1/02; H01B 1/04
[52] U.S. Cl. .................................... 428/457; 427/96; 427/122; 427/123; 427/126.1; 427/126.2; 428/689; 428/697
[58] Field of Search ............. 427/96, 122, 123, 126.1, 427/126.2; 428/209, 210, 427, 910, 689, 697, 457

[56] References Cited

U.S. PATENT DOCUMENTS

| | | |
|---|---|---|
| 3,663,276 | 5/1972 | Allington et al. ................... 117/201 |
| 4,079,156 | 3/1978 | Yontsey et al. ....................... 427/96 |
| 4,122,232 | 10/1978 | Kuo ..................................... 428/323 |
| 4,273,822 | 6/1981 | Bube ................................... 428/216 |
| 4,322,316 | 3/1982 | Provance et al. ................... 252/512 |
| 4,323,483 | 4/1982 | Rellick ............................... 252/512 |
| 4,388,347 | 6/1983 | Shum et al. .......................... 427/96 |

*Primary Examiner*—George F. Lesmes
*Assistant Examiner*—William M. Atkinson
*Attorney, Agent, or Firm*—Thomas K. McBride; William H. Page, II; Raymond H. Nelson

[57] ABSTRACT

Conductive pigment-coated surfaces which are resistant to the effect of moisture may be prepared by admixing an alloy consisting of a conductive nonnoble metal such as copper and preferentially oxidizable material such as boron with a lead-containing compound such as lead oxide. The resulting composite may be further mixed with an organic vehicle to form a conductive ink which, after being painted on a substrate such as alumina and subsequently fired, will provide a conductive pigment-coated surface which is moisture-resistant and which will possess excellent conductive characteristics.

18 Claims, No Drawings

CONDUCTIVE PIGMENT-COATED SURFACES

CROSS-REFERENCE TO RELATED APPLICATION

This application is a continuation-in-part of our co-pending application Ser. No. 439,166 filed Nov. 4, 1982 and now abandoned.

BACKGROUND OF THE INVENTION

The use of thick-film resistors, capacitors, etc. parts in microcircuits is becoming of increasing importance in the electrical and electronic field. These thick-film components which comprise a layer of ink or paste which may be conductive, partially conductive, semiconductive or nonconductive in nature are deposited on a ceramic substrate by a process which is similar in nature to the silk-screening method whereby a pattern of films is laid down to form conductors, dielectrics, resistors, capacitors or semiconductors. Following the deposition of the film on the substrate, the resulting material is then fired to a temperature usually ranging from about 500° to about 1000° C. or more in air whereby the film is firmly affixed to the substrate. The resultant paste or ink substrate combination can form a microcircuit of passive components and, in addition, if so desired, discrete active components such as transistors or integrated circuit chips can be attached separately to form a thick-film hybrid device.

As hereinbefore set forth, the use of thick-film items or products is becoming more important due to the advantages which these items offer over other technology such as discrete parts, printed circuits, thin films, etc. For example, the designs which are used which have thick-film networks are easy, quick and flexible with low development costs and offer the design freedom and variety of parameter values which are normally available with discrete parts. Furthermore, circuits formed from thick films can combine many types of components such as high value capacitors, resistors, etc., which are not possible with monolithic products. In addition, the method of preparation of thick-film devices is simple inasmuch as the screen printing and heating processes are easy to control and automate. This is in contradistinction to thin-film networks which require a great degree of care in the sputtering and evaporating processes. The operation advantages which are possible when utilizing thick-film devices include high reliability which results from the use of fewer interconnection points. Furthermore, in contrast with discrete parts, the thick-film devices have improved resistance matching and temperature tracking capabilities.

All of the above-enumerated advantages will permit the use of thick-film devices in consumer radio and television products as well as in computers and in industrial electronic devices. These thick-film devices such as resistor networks may be used to replace the carbon resistor while hybrid modules including a thick-film device may be used in television circuits for the horizontal and vertical oscillators, high-voltage dividers and chroma signal processors. Additional uses for these devices are found in telephones, two-way radios, multiplexers, insulators, voltage regulators and heating aids. Likewise, these devices may also be used in industrial control systems such as analog-to-digital and digital-to-analog converters, operation amplifiers, servo amplifiers, power amplifiers and power supply regulators, while in the automotive field hybrid thick-film devices may be used in fuel injection systems. It is thus readily apparent that thick-film devices find a wide variety of uses in many fields.

The silk-screen conductor pastes which are currently in use are produced by combining a noble metal pigment such as gold, silver, platinum, palladium, etc., with a powder glass mixture, an organic vehicle and an organic binder. Thereafter, the paste is silk-screened onto a ceramic substrate and thereafter taken through a firing cycle at a temperature in the range hereinbefore set forth which first burns off the organic vehicle and thereafter melts the glass frit. On cooling, the product is a distribution of metal pigment in a glassy matrix which possesses an electrical conductivity sufficient to produce minimal and predictable resistance in the electric circuit.

The most common commercial inks which are used in thick-film circuitry, as hereinbefore set forth, are based on the noble metals. However, due to the volatility of the prices of these noble metals as well as the availability thereof, there is a strong incentive to replace the noble metal pigments with a nonnoble metal pigment which would result in less costly conductors. While several nonnoble metal systems are currently in use, there are certain disadvantages inherent in these systems which prevent a wide acceptance of the system. One drawback in using these nonnoble conductive metals such as nickel or copper has been that these metals are subject to a relatively ready oxidation of the metal, thereby reducing the conductivity of the metal to a point where it is insufficient in conductive properties to be useful in microcircuits. Another disadvantage is that the inks or conductive surfaces possess a poor solderability. Currently, copper-based systems do possess good electrical conductivity. However, the firing of the ink must be accomplished either in an inert atmosphere or at a low temperature such as a maximum of 700° C. To overcome this relatively low temperature firing, it has been necessary to incorporate a selective oxidatable material into the ink. U.S. Pat. No. 4,122,232 discloses a paste which is used in forming a base metal thick-film electrical conductor which comprises mixing the paste consisting of a base metal powder such as nickel, copper, cobalt or mixtures thereof with a boron powder and a vehicle and a glass frit, said vehicle comprising an organic compound of the type well known in the art. A somewhat similar conductive ink is disclosed in U.S. Pat. No. 4,322,316 which discloses a thick-film conductor paste consisting of boron, copper oxide, and a glass frit as well as an inert vehicle.

Various U.S. patents have shown different inks. For example, U.S. Pat. No. 3,663,276 deals with inks which are used as resistors having a resistance greater than 100,000 ohms per square. However, this reference uses noble metals or noble metal oxides with nonnoble metals of given concentrations. The nonnoble metals oxidize upon firing, thus becoming nonconductive in nature and providing the desired high resistivity. Other U.S. Pat Nos. such as 3,843,379, 3,811,906 and 3,374,110 describe utilizing a noble metal that is mixed with a vitreous frit, an organic binder, a solvent and is thereafter fired in an air atmosphere at an elevated temperature. These patents describe the use of noble metals such as gold, silver, palladium or mixtures thereof. As will hereinafter be shown in greater detail, the process of the present invention uses a nonnoble metal alloy that can be air-fired under elevated temperatures, thus permitting the oxidation of the oxidizable material in preference to the nonnoble metals under the conditions of firing. While certain U.S. Pat. Nos. such as 3,647,532 and 2,993,815 describe the use of nonnoble metals as conductive inks, it is necessary that these inks utilize a furnace with an accurately controlled special type atmosphere. For example, in the former patent, the firing is effected in an essentially neutral or inert atmosphere, except that it contains sufficient oxygen and claims that the upper limit of the oxygen which is present is 0.1% by volume. Further, this reference also utilizes a reducing agent within the ink such as hydrazine hydrate which when decomposed at elevated temperatures releases hydrogen and reacts with excess oxygen, thus preventing oxidation of the base matter in the essentially neutral atmosphere. The purpose of the low oxygen content in this patent is to burn off the binder, but it cannot be any higher inasmuch as it will oxidize the conductive metal and render the ink electrically nonconductive. By utilizing this inert or essentially neutral atmosphere, the atmosphere is identical to a rare gas such as neon, argon, krypton, xenon, radon, etc., which show practically no tendency to combine with other elements. Therefore, an inert atmosphere is neither oxidizing nor reducing which is in contradistinction, as hereinafter set forth in greater detail, to the oxidizing atmosphere of the present invention. U.S. Pat. No. 2,993,815, hereinabove cited, uses two firing operations. The first firing is effected in an air, oxygen or mixed oxygen and inert gas environment so as to form the glass-metal bond. Following this, the second firing is effected in a reducing atmosphere possessing a critical composition of nitrogen, hydrogen and small amounts of oxygen to reduce the oxidized metal. Nonnoble metals such as copper, nickel, alloys of nickel and copper or iron when fired in an air atmosphere at 840° C. are known to oxidize rapidly and therefore will no longer be able to be utilized as conductive metals.

It is also known that reducing agents can be added to the glass frit. However, this produces spotty conduction zones. The addition of antimony, chromium, charcoal or other oxygen scavengers can be mixed or blended into the conductive ink, but on firing, reduction is nonuniform and will tend to occur only where the oxygen scavenger is present. U.S. Pat. No. 3,711,428 describes the mixing of charcoal with the ink. However, this action is taken to prevent blistering or cratering of the resistor, the charcoal burning off and thus leaving the metal exposed for oxidation. While this does not cause problems for the noble metal, there is substantial oxidation of nonnoble metals such as copper. Another U.S. Pat. No. 2,795,680, utilizes a ceramic base to which is bonded a cross-linked epoxy resin and a conductive and nonconductive powder. The resin is cross-linked at 250° C. which is well below the firing temperature which is utilized in the present invention. In the event that resistors need to be cofired, the conductor ink could not withstand the higher temperature.

U.S. Pat. No. 3,943,168 discloses conductor compositions comprising nickel borides in which the compositions are finely divided inorganic powders comprising one or more compounds of nickel such as a mixture of nickel boride and nickel boride-silicide. It is also stated in this patent that the compositions may contain nickel metal powder in which the nickel powder may comprise up to 8% of the total weight of the nickel and nickel compounds present. Likewise, U.S. Pat. No. 4,130,854 discloses a borate-treated nickel pigment for metalizing ceramics, the borate coating forming a glass on the surface of the nickel powder, the borate forming an oxidation resistant film which aids in the adhesion of the nickel to the substrate.

In addition to the aforementioned U.S. patents, two other U.S. patents disclose conductive metal pigments. U.S. Pat. No. 4,079,156 describes a conductive metal pigment which is prepared by alloying a nonnoble conductive metal with an oxidizable material followed by mixing the resulting alloy with a vitreous frit and an organic vehicle to form an ink. The ink is then screened onto a substrate followed by firing in an oxidizing atmosphere for a period of time sufficient to oxidize the oxidizable material without oxidation of the nonnoble metal. The oxidizable material is present in the alloy in an amount within the range of from about 0.1 to about 10% by weight of the alloy. Likewise, U.S. Pat. No. 4,388,347 describes a conductive pigment-coated surface in which a nonnoble conductive metal is alloyed with from about 12% to about 25% by weight of an oxidizable material, mixing the alloy with an organic vehicle to form an ink and thereafter following the same steps as shown in the previous patent to produce a conductive pigment-coated surface. In addition, a vitreous frit containing mixtures of oxides of various metals such as silicon, calcium, sodium, magnesium, iron, zinc, tin, etc. may also be present in the conductive pigment. The presence of a frit in the conductive pigment differs greatly from the lead-containing compound of the present invention inasmuch as the glass frit is a noncrystalline or amorphous material which possesses little or no long-range atomic order. In contradistinction to this, the lead-containing compounds such as lead oxide, etc. are crystalline materials with a definite atomic order and cannot be considered frits.

The inks or conductive pigment-coated surfaces which have been previously mentioned in the discussion of previous U.S. patents do possess another disadvantage in that the inks are attacked to some degree by water. The susceptibility to moisture is due in all probability to the water solubility of the boron oxide glass which is produced during the firing step of the process. As will hereinafter be shown in greater detail, it has now been discovered that, by adding a lead-containing compound of the type hereinafter set forth, it is possible to obtain improved physical and electrical characteristics of the conductive pigment-coated surface produced by the process of the present invention.

BRIEF SUMMARY OF THE INVENTION

This invention relates to novel conductive metal pigment surfaces and to a process for the preparation thereof. More specifically, the invention is concerned with novel conductive metal pigments which are prepared by forming an alloy of a nonnoble conductive metal and at least one oxidizable material, admixing this nonnoble conductive alloy with a lead-containing compound, adding the admixture to an organic vehicle followed by firing the mixture in an air atmosphere at a temperature in excess of about 1000° F. whereby the oxidation of said oxidizable material is effected without oxidation of the nonnoble conductive metal and thus affords a conductive metal pigment which is water-resistant and which will also possess excellent electrical characteristics.

As hereinbefore set forth, in view of the relatively expensive cost of noble materials such as gold, platinum, palladium, silver, etc., it is an economical advantage for the manufacturers of conductive inks to utilize nonnoble metals when preparing conductive pigments for use in thick-film devices. However, the nonnoble metals must be able to withstand the oxidizing environment of the firing operation. The mixture of the conductive metal and organic vehicle, when silk-screened onto the substrate and taken through a firing cycle, will burn off the organic vehicle. The oxide that is formed from the oxidizable material may also flow and aid the bonding of the particles. Therefore with this alloy the vitreous frit is not always necessary. However, many of previously formed conductive pigments may also contain a vitreous frit. Thus, when using ceramic substrates on which the conductive pigment is combined, the vitreous frit, which may be in the form of glass, can assist to both bind the metal particles which form the conductive portion of the pigment together and, in addition, will also act to bind the particles to the substrate. It is therefore necessary to fire the combination at such a temperature so that the glass will flow and also for particle sintering to occur and thus act in a manner to which it is intended.

The conductive pigment which is prepared according to the process of this invention will possess desirable physical characteristics and properties which are greater than those found in conductive metal pigments containing frits which have been prepared according to methods set forth in other patents. In addition to possessing the ability to withstand attack by water, the pigments prepared according to the process of the present invention will possess an increased resistance to oxidation as well as an increased fired strength. The increase in resistance to oxidation is particularly beneficial inasmuch as it is necessary for the conductive metal pigment such as an ink to withstand multiple or longer term firings without a subsequent degradation. Another advantage which is inherent in the increased resistance to oxidation is that it also improves solder-ability inasmuch as this would be effected by an oxidized layer on the surface of the conductor. Likewise, the increase in firing strength would also afford an advantage inasmuch as the higher strength is necessary for the durability of an electrical circuit utilizing such an ink both in handling and in service. This is particularly applicable inasmuch as many of the connections would be of the clip contact type, a strong conductor being required in order to withstand the clip pressure without flaking. The advantageous properties of the conductive pigment prepared according to the process of the present invention is unexpected in view of the fact that oxides of the type used to prepare inks are usually or generally brittle in nature and therefore the addition of a relatively large amount of oxidizable material, which during the preparation of conductive ink is converted to oxide would be expected to decrease, rather than increase, the physical strength of the ink as is measured by adhesion measurements. Likewise, the reduction of the conductivity of the resulting pigment was unexpected in view of the fact that oxidizable materials are nonconductive in nature and thus, when adding a relatively large amount of oxidizable material, it would be expected that the conductivity of the nonnoble conductive metal would not be affected. In addition, when using a lead-containing compound of the type hereinafter set forth in greater detail in conjunction with an alloy of a nonnoble conductive metal and an oxidizable material, the resulting conductive pigment is resistant to moisture, thus permitting the conductive pigment surface such as an ink to be used in situations where exposure to moisture is inevitable. As will be shown in greater detail, the inks will retain their integrity after exposure to moisture, especially in the form of boiling water, and will not break down by crumbling, flaking, etc., thus permitting the conductive pigment surface such as an ink to be used in situations where exposure to moisture is inevitable. As will be shown in greater detail, the inks will retain their integrity after exposure to moisture, especially in the form of boiling water, and will not break down by crumbling, flaking, etc.

It is therefore an object of this invention to provide a conductive metal pigment comprising an alloy consisting of a nonnoble conductive metal and an oxidizable material in admixture with a lead-containing compound.

A further object of this invention is to provide a process for preparing a conductive metal pigment such as an ink utilizing an alloy comprising a mixture of a nonnoble metal as a conductive element with an oxidizable material in admixture with a lead-containing compound.

In one aspect, an embodiment of this invention resides in a conductive water-resistant, pigment-coated surface comprising an alloy of a nonnoble conductive metal and at least one oxidizable material in admixture with a lead-containing compound.

A further embodiment of this invention resides in a process for the preparation of a conductive water-resistant, pigment-coated surface which comprises alloying a nonnoble conductive metal with at least one oxidizable material, admixing said alloy with a lead-containing compound, mixing the resultant admixture with an organic vehicle to form an ink, screening said ink onto a substrate, thereafter firing said ink in an oxidizing atmosphere at a temperature in excess of about 1000° F. for a period of time sufficient to oxidize said oxidizable material with oxidation of said nonnoble metal, cooling the thus fired product, and recovering the resultant conductive water-resistant, pigment-coated surface.

A specific embodiment of this invention is found in a conductive pigment-coated surface which comprises an alloy of copper and boron in admixture with lead oxide, said lead oxide being present in an amount in the range of from about 0.5 to about 10 times the amount of boron present in the alloy of copper and boron.

Another specific embodiment of this invention is found in a process for the preparation of a conductive pigment-coated surface which comprises alloying copper with boron, said boron being present in said alloy in a range of from about 5% to about 20% by weight of said alloy, admixing the resultant alloy with lead oxide, said lead oxide being present in said admixture in an amount in the range of from about 0.5 to about 10 times the amount of boron present in said alloy, mixing the resultant admixture with an organic vehicle to form an ink, screening said ink onto a ceramic substrate, firing said ink at a temperature in the range of from about 1100° to about 1800° F. in an oxidizing atmosphere, cooling the conductive ink to produce a conductive pigment-coated surface and recovering said conductive pigment-coated surface.

Other objects and embodiments will be found in the following further detailed description of the invention.

DETAILED DESCRIPTION OF THE INVENTION

As hereinbefore set forth, the present invention is concerned with conductive pigment-coated surfaces comprising an admixture of an alloy consisting of a nonnoble metal as the conductive element in conjunction with an oxidizable material, said alloy being in admixture with a lead-containing compound, as well as to a method for preparing these pigments. The pigment-coated surfaces of the present invention will possess excellent conductivity characteristics which may be maintained within a desired range and in addition, will exhibit excellent water-resistant characteristics, thereby enabling the use of these pigments in instances where the same are subjected to moisture or water. Inasmuch as the conductive materials of the nonnoble metal type which are usually utilized in circuits are readily oxidized when heated in air, and that the aforesaid method of preparing the conductive pigments for use in devices of the thick film type were effected by firing a combination of a conductive metal and a vehicle, it is unexpected that such a pigment could be prepared in the usual manner when utilizing a nonnoble metal such as nickel or copper as a conductive element without the aforesaid oxidation of the conductive metal. It is known that carbon oxidizes very rapidly and will not produce a substrate as effectively as other reducing agents. Likewise, a nickel powder admixed with carbon powder does not possess relatively good conductivity. However, if a nickel-carbon alloy is prepared in a proper manner, it has been found that the oxidation of carbon in the alloy is slower than if the carbon in the form of charcoal is mixed in with nickel, probably due to the fact that in the alloy the carbon must diffuse through the lattice to the surface. An alloy which is correctly formed will prevent localized oxidation and will not leave sections of the fired ink either nonconductive or highly resistive. It is therefore necessary to form an alloy which is composed of two or more metals or elements, one of which comprises the nonnoble conductive metal while the other comprises an oxidizable material which is preferentially oxidized. By using such a preferentially oxidized material which includes, but is not limited to, carbon, boron, silicon, aluminum, etc., or combinations of these metals such as carbon-silicon, boron-silicon, etc., it is possible to obtain the desired result. Thus, for example, a more mobile alloying element such as boron, carbon or silicon can diffuse through the crystal lattice at an elevated temperature, being preferentially oxidized and thus prevents oxidation of the conductive nonnoble metal. One of the benefits which is attained by practicing the present invention is that the presence of a vitreous frit or glass is not necessary inasmuch as the nonnoble metal alloy forms its own glass when reacting with the oxide. By eliminating the presence of a vitreous frit or glass, the addition of a reducing agent becomes completely unnecessary for the preparation of a conductive pigment according to the process of the invention. Another benefit of the present invention is that the utilization of this particular type of nonnoble metal and readily oxidizable material alloy will produce uniformly thick films.

In one embodiment, the alloy is formed by combining a nonnoble conductive metal such as nickel, copper, aluminum, etc. and the preferentially oxidizable material of the type hereinafter set forth.

The alloys which comprise the starting material in the process of this invention may be prepared in any manner known in the art. For example, one method of preparing the alloy is to prepare a molten solution of the nonnoble conductive metal such as nickel or copper and the oxidizable material such as carbon, silicon, boron, aluminum, combinations of boron and silicon, boron and aluminum, boron and carbon, etc., following which the solution may be spray atomized to form spherical particles of the alloy. In this method, the material which is preferentially oxidized can be alloyed in the nonnoble conductive metal as a second phase, such as boron in nickel or cooper and/or dissolved in the metal as a single phase.

In the preferred embodiment of the invention the readily oxidizable material is present in the alloy in an amount in the range of from about 5% to about 20% by weight of the alloy, although it is also contemplated within the scope of this invention that the amount of oxidizable material may range up to about 25% by weight, although the resulting alloy may not necessarily give equivalent results. The resulting alloy which has been obtained by the above method may then be admixed with a lead-containing compound, examples of lead-containing compounds including elemental lead, lead oxide, or alloys of lead such as lead-copper or lead-nickel alloys, etc. The conductive pigment may be prepared by adding the lead-containing compound to the alloy as a discrete oxide addition or as a discrete nonoxide particle in which the lead is present in elemental form, said admixture being accomplished by any means known in the art such as a physical mixture of the alloy, which has been ground to particle size, with particles of the lead-containing compound. After thoroughly admixing to insure a complete and total dispersion of the alloy and lead-containing particles, the resultant admixture may then be processed in a manner hereinafter set forth. The lead-containing compound which is used to impart water-resistant characteristics to the conductive pigment-coated surface is present in the final admixture in an amount in the range of from about 0.5 to about 10 times the amount of the oxidizable material which is present in the nonnoble metal, oxidizable material alloy. As will hereinafter be shown in greater detail, it was unexpected that the presence of lead-containing compound imparts a desirable water-resistant characteristic to the pigment surface in view of the fact that other metals or metal oxides do not, when admixed with the alloy, impart such desirable characteristics to the finished product.

In one embodiment, the admixture of the alloy and the lead-containing compound may be admixed with an organic vehicle which, if so desired, may contain an organic binder to form an ink. Inasmuch as the preferentially oxidizable material will form its own glass, and one purpose of the glass is to bind the conductive pigment to a substrate of the type hereinafter set forth in greater detail, the presence of a vitreous frit will not be required in the formation of the ink, and thus will assist in eliminating certain undesirable characteristics which are attendant with the presence of a frit in the conductive pigment. After screening said ink onto a substrate such as a ceramic which may be formed of alumina, silica-alumina, or ceramic-coated metal such as enameled steel, etc., the alloy is fired in an oxidizing atmosphere which is formed by the presence of an oxygen-containing gas such as air, oxygen, etc. The air firing operation which is effected at temperatures in excess of about 1000° F. accomplishes two important functions. The first function is that the base of nonnoble conductive metals such as copper is not oxidized in the highly oxidizing atmosphere so that it remains highly and uniformly conductive, while the second function of the firing operation is that the preferentially oxidizable material reacts with the admixed metal oxide addition and forms the water-resistant glass which fuses the particles together and to the substrate, thus acting as a barrier which will reduce the diffusion of oxygen into the nonnoble metal. The term "air atmosphere" as used in the present specification will refer to an atmosphere consisting of nitrogen, oxygen, carbon dioxide, etc. The components of this air atmosphere, exclusive of water vapor, as stated in the CRC HANDBOOK OF CHEMISTRY AND PHYSICS consist of approximately 20.9% by volume of oxygen, 78.0% by volume of nitrogen, 0.33% by volume of carbon dioxide and 0.93% by volume of argon. Therefore, the oxidizing atmosphere in which the ink is fired will contain a lower limit of approximately 20% by volume of oxygen and may, if so desired, consist of 100% by volume when utilizing pure oxygen. After firing the alloy in this oxidizing atmosphere for a period of time which is sufficient to oxidize the preferentially oxidizable material without oxidation of the nonnoble conductive metal, the thus fired product is cooled and recovered.

In another embodiment, the vehicle which is utilized as one component of the conductive ink will usually comprise an organic binder with an organic solvent which is utilized to reduce or to obtain the proper viscosity of the mixture in order to silk-screen the conductive ink onto the desired substrate. For example, the vehicle may be a mixture of resin binder such as ethyl cellulose while the organic solvent may comprise a low-cost organic material such as pine oil. The substrate can be a ceramic such as alumina, silica-alumina, etc. The conductive ink consisting of a mixture of the conductive pigment, the metal or oxide addition and the vehicle may comprise from about 75% to 95% of the conductive pigment and addition and from about 5% to about 25% organic vehicle.

The resulting composite is then fired at a temperature above about 1000° F., the dissolved preferentially oxidizable material will then diffuse to the surface of the nonnoble metal and will therefore be readily available for preferential oxidation.

The resulting conductive pigment-coated surface which consists essentially of an alloy of a nonnoble conductive metal and a preferentially oxidizable material in admixture with a lead-containing compound such as elemental lead, lead oxide or lead alloys will exhibit the desired conductive characteristics and water-resistant characteristics which are not present when other components of a conductive pigment-coated surface are present.

By utilizing an alloy of the type hereinbefore set forth in admixture with a lead-containing compound, it is possible to airfire a conductive ink containing this admixture as well as an organic vehicle which acts as a solvent plus a low temperature organic binder such as pine resin, ethel cellulose, etc. on a substrate in an oxidizing atmosphere and temperatures in excess of about 1000° F. and preferably in a range of from about 1200° to about 1800° F. or more to produce a conductive pigment in which the nonnoble conductive metal retains the desired conductive characteristics without imparting a deleterious effect on the conductive properties of the metal as well as rendering the pigment relatively inert to the action of moisture or water thereon. The use of this type of firing technique ensures that the base conductive metal is not oxidized to such a state whereby it will not be highly and uniformly conductive, but will possess an increased resistance to oxidation, will also possess an increase in fired strength and will maintain an excellent adhesion to the substrate. In addition, it is possible to avoid the necessity for firing the conductive pigment in an essentially neutral atmosphere which is neither oxidizing or reducing in nature and which would possibly require the presence of a reducing compound in order to prevent any oxidation, thereby contributing to an increase in the overall cost or expense of producing such a conductive pigment.

The conductive pigments of the present invention may be prepared, preferably in a batch type operation, by grinding the nonnoble conductive metal and the preferentially oxidizable material to particles which may range in size from about 0.1 to about 100 micrometers in diameter, admixing the particles and thereafter hydrostatically pressing the mix to form a compact mass. If so desired, the mass may then be arc melted and splat quenched to improve the homogeneity of the alloy. The alloy is then ground to a powder and admixed with the lead or lead oxide of the type hereinbefore set forth in greater detail which is also in the form of a powder. Sizes of both of these powders may range from 0.1 to 25 micrometers in diameter. Thereafter, the admixture of the alloy and the lead-containing compound may be added directly to a low temperature organic binder. The binder may comprise a carrier such as terpineol mixed with a solvent such as ethyl cellulose and a viscosity modifier.

The thus-formed ink may then be painted on the surface of a carrier or substrate such as a ceramic which may be formed of an alumina, silica-alumina br ceramic-coated metal such as enameled steel, etc. The binding of the ink on the substrate is accomplished so that the desired thickness and width of the finished ink may be within the parameters which have been determined prior to the painting step of the process. Following the screening or painting of the ink on the substrate, the volatiles which are present in the binder may be removed by heating the painted substrate at an elevated temperature sufficient to volatilize the undesired compounds. Thereafter the alloy is fired in an oxidizing atmosphere which is formed by the presence of an oxygen-containing gas such as air, oxygen, etc., in an appropriate apparatus such as a belt furnace, etc. The air firing operation which is effected at temperatures in excess of about 1000° F. accomplishes two important functions. The first function is that the base of nonnoble conductive metals such as copper is not oxidized in the highly oxidizing atmosphere so that it remains highly and uniformly conductive, while the second function of the firing operation is that the preferentially oxidizable material reacts with the admixed lead-containing compound to form the water-resistant glass which fuses the particles together and to the substrate, thus acting as a barrier which will reduce the diffusion of oxygen into the nonnoble metal. After firing the alloy in an oxidizing atmosphere for a period of time which is sufficient to oxidize the preferentially oxidizable material without oxidation of the nonnoble conductive metal, the thus fired product is cooled and recovered.

The following examples are given to illustrate the conductive pigment-coated surfaces of the present invention and to a method for the preparation thereof. However, it is to be understood that these examples are given merely for purposes of illustration and that the present process is not necessarily limited thereto.

EXAMPLE I

A conductive pigment-coated surface of the present invention was prepared by premixing particles of copper and boron having a size ranging from 0.1 to 100 micrometers followed by hydrostatically pressing the mix to 30,000 psi to form a compact mass. Following this, the alloy of copper and boron, in which the boron was present in the alloy in an amount of 8% by weight of the alloy, was ground into a powder using a wiggle bug type grinder. The alloy was then thoroughly admixed with lead oxide to form the desired admixture. Upon complete admixture, the dry powder was further mixed with a low temperature organic binder which was prepared by combining 95% by weight of terpineol prime with 4.5% by weight of ethyl cellulose and 0.5% by weight of staybellite which is a viscosity modifier. The completed ink contained 10% by weight of the carrier/binder. Seven samples of this ink were prepared containing varying amounts of lead oxide, the amount of lead oxide ranging from 6% by weight to 23% by weight of the solids in the conductive pigment composite.

Each of the composites containing varying amounts of lead oxide were painted on a ceramic substrate, the inks being generally 0.04 to 0.090" in width and ranging from 0.004 to 0.008" in thickness. After painting the ink on the substrate, the volatiles in the carrier/binder were removed by heating the circuit to a temperature of approximately 212° F. for a period of 15 minutes. The circuits were then placed in an open-end tube furnace and fired by subjecting the circuits to several different firing temperatures, the peak temperature being used for a period of 10 minutes. After firing, the circuit sheet resistivity was determined by measuring the resistance of the strip and calculating the resistivity. The thickness was also recorded inasmuch as the sheet resistivity varies with the conductor thickness.

In addition, the water solubility of the ink was evaluated by immersing the fired circuit into a water bath in which the temperature of the water was maintained at 120° F. for a period of 10 minutes. The results of these tests are set forth in Table I below:

TABLE I

| Sample | PbO$_2$ Content, Wt. % of Solids | Peak Firing Temp., °F. | Fired Thickness, Inches | Sheet Resistivity, Ohms/Square |
|--------|---------|------|------|------|
| A | 6 | 1292 | .008 | .006 |
|   |   | 1562 | .007 | .006 |
| B | 11 | 1292 | .010 | .006 |
|   |   | 1562 | .012 | .007 |
| C | 15 | 1292 | .009 | .006 |
|   |   | 1562 | .007 | .005 |
| D | 17 | 1562 | .012 | .005 |
|   |   | 1562 | .012 | .005 |
| E | 18 | 1562 | .010 | .006 |
|   |   | 1562 | .015 | .006 |
| F | 19 | 1562 | .008 | .005 |
| G | 23 | 1562 | .009 | .010 |

As will be noted, all of the lead oxide containing inks were very conductive, little or no pressure being required on the probes to obtain a resistance measurement. The fired inks maintained a metallic appearance and, in addition, the inks containing lead oxide were not attacked by immersion in the water, maintaining their original appearance and had small change in adhesion to the substrate while those without lead oxide were severely attacked.

EXAMPLE II

A conductive pigment-coated surface similar in nature to that set forth in Example I above was prepared, however, the lead oxide was omitted. Pigments were prepared by admixing particles of copper and boron and hydrostatically pressing the alloy to form a compact mass. Following this, the alloy was ground to a powder in a wiggle bug type grinder for a period of time which varied between 6 and 30 minutes. The particle size of the alloy ranged up to 25 micrometers. The resulting alloy was mixed with a carrier binder comprising 95 wt. % terpineol prime, 4.5 wt. % of ethyl cellulose and 0.5 wt. % of a viscosity modifier comprising staybellite. As in the previous experiment, the resulting ink was painted on a substrate and the volatiles present in the carrier were removed by heating the temperature to 212° F. for a period of 10 minutes. The circuits were then inserted into different zones of an open-ended tube furnace for various periods of time. The maximum or peak temperatures were set at 1112°, 1292° and 1561° F. The time at which the circuit was exposed to the peak temperature was 10 minutes.

Again, after firing the circuit, the sheet resistivity was determined in a similar manner using a Simpson voltohmmeter by measuring the resistance of the strip and calculating the resistivity. The results of these tests are set forth in Table II below in which sample A contained 5 wt. % boron, sample B contained 8 wt. % boron, sample C contained 10 wt. % boron, and sample D contained 15 wt. % boron.

TABLE II

| Sample | Wt. % Boron | Peak Firing Temp., °F. | Fired Thickness, Inches | Sheet Resistivity, Ohms/Square |
|--------|-------------|------|------|------|
| A | 5 | 1152 | .006 | .009 |
|   |   | 1152 | .006 | .004 |
|   |   | 1292 | .010 | .006 |
|   |   | 1292 | .010 | .009 |
|   |   | 1562 | .007 | .005 |
|   |   | 1562 | .007 | .005 |
|   |   | 1652 | .008 | .005 |
|   |   | 1652 | .008 | .005 |
| B | 8 | 1152 | .015 | .045 |
|   |   | 1152 | .025 | .022 |
|   |   | 1292 | .015 | .004 |
|   |   | 1292 | .025 | .004 |
|   |   | 1562 | .020 | .004 |
|   |   | 1562 | .020 | .004 |
| C | 10 | 1152 | .008 | .020 |
|   |   | 1152 | .008 | .016 |
|   |   | 1292 | .008 | .008 |
|   |   | 1292 | .008 | .007 |
|   |   | 1652 | .010 | .004 |
|   |   | 1652 | .010 | .004 |
| D | 15 | 1152 | .005 | .012 |
|   |   | 1152 | .005 | .015 |
|   |   | 1292 | .005 | .004 |
|   |   | 1292 | .005 | .004 |
|   |   | 1652 | .005 | .003 |
|   |   | 1652 | .005 | .004 |

In addition, the inks were subjected to a water solubility test in which the inks on the substrate were immersed in a water bath, and maintained at a temperature of 120° F. for a period of 10 minutes. After removal of the circuits, a scratch test showed a flaking of the ink from the substrate, the scratch strength of the samples being low.

It is therefore apparent from a comparison of conductive pigment-coated surfaces which contain a lead oxide with conductive pigment-coated surfaces which do not contain the lead oxide, the former will exhibit comparable resistivities and, in addition, will possess the desirable characteristics of being moisture-resistant, the latter characteristics being of importance when the conductive surfaces are exposed to moisture.

EXAMPLE III

As a further illustration of the ability of the conductive pigments of the present invention to withstand change after being subjected to moisture, a series of conductive pigments or inks were prepared, several of the inks containing no additional lead oxide while others contained varying amounts of lead oxide. The inks were prepared in a manner similar to that set forth in the above examples, and after being painted on a substrate and fired, were immersed in water baths which were maintained at a temperature in the range of from 100° to 120° F. for periods of time ranging from 5 to 10 minutes. The circuits were subjected to a scratch test prior to and subsequent to immersion in the water bath. The results of these tests are set forth in Table III below:

TABLE III

| Sample | Boron Content, Wt. % | PbO$_2$ Content, Wt. % of Solids | Firing Temp., °C. | Resistance ohms | Adhesion Rating* | Water Testing Temp., °F. | Minutes | Adhesion Rating After Water Test |
|---|---|---|---|---|---|---|---|---|
| A | 15 | 0 | 850 | 0.3 | 8 | 100 | 5 | 1 |
| B | 25 | 0 | 850 | 2.3 | 9 | 100 | 5 | 1 |
| C | 10 | 15 | 850 | 0.1 | 8 | 120 | 5 | 6 |
| D | 7.1 | 5.3 | 850 | 0.1 | 7 | 120 | 10 | 6 |
| E | 7.1 | 10.6 | 850 | 0.1 | 7 | 120 | 10 | 6 |
| F | 7.1 | 21 | 850 | 0.1 | 9 | 120 | 10 | 8 |
| G | 7.1 | 0 | 850 | 0.2 | 7 | 120 | 10 | 1 |

*Before water test

The values which were assigned to the strips for adhesion ratings ranged from 1-9, 1 being a poor adhesion that falls apart when subjected to a scratch test, while 9 is the strongest rating obtainable and connotes a substance which is impervious to scratching, retains its original appearance and shape and in some instances is stronger than the substrate upon which the ink has been painted. It is noted that the conductive inks which did not contain a metal oxide such as lead oxide possess excellent adhesion ratings in the original sample, but were attacked by the action of water and exhibited very poor adhesion ratings after immersion in water at an elevated temperature. Conversely, the inks which contained lead oxide in an amount ranging from about 0.75 to about 3 times the amount of boron present in the copper-boron alloy exhibited excellent adhesion ratings after being subjected to immersion in the water at an elevated temperature, the ratings dropping only 1 unit. Therefore, it is apparent that the above comparison graphically illustrates the ability of the conductive pigment of the present invention to withstand attack by moisture than conductive pigments which do not contain lead oxide.

EXAMPLE IV

To illustrate the ability of lead oxide to impart a water-resistant characteristic to the ink, a conductive pigment-coated surface was prepared utilizing other metal oxides. The samples of such surfaces were prepared by forming a conductive ink comprising a mixture of boron oxide and copper. The alloy of boron and copper was admixed with varying amounts of metal oxides in a factorial experiment. Comparisons of inks comprising the boron-copper alloy in admixture with 25%, 50% and 75% respectively of silicon oxide, aluminum oxide, magnesium oxide, calcium oxide and lead oxide were screened onto an alumina substrate and fired at 850° C. Following this, the inks were then immersed in a water bath in a manner similar to that set forth in Example I above.

All of the lead-containing inks were found to be minimally attacked by the water immersion in contrast to the inks containing the other metals such as silicon, aluminum, magnesium and calcium, the inks containing the latter metals exhibiting poor flaking and low adhesion characteristics when subjected to a scratch test. In addition, all of the lead oxide-containing inks were found to be very conductive as well as possessing a good appearance.

EXAMPLE V

In addition to the above experiments, a series of inks were prepared utilizing a process similar to that set forth in Example I above. The inks which were prepared contained varying amounts of materials other than the lead-boron alloy and lead or lead oxide. The various inks after firing were tested for sheet resistivity using a Simpson volt-ohmmeter in a test similar to that set forth in Examples I and II above. The various inks were designated as follows:

TABLE IV

| | Alloy Wt. % | Glass Frit Wt. % |
|---|---|---|
| A | 98% Cu, 2% B | — |
| B | 85% Cu, 5% B, 10% Al | 9% |
| C | 85% Cu, 15% B, | 5% |
| D | 85% Cu, 15% B | 9% |
| E | 85% Cu, 15% B | 33% |
| F | 80% Cu, 15% B, 5% Al | — |
| G | 80% Cu, 15% B, 5% Al | 5% |
| H | 80% Cu, 15% B, 5% Si | — |
| I | 80% Cu, 15% B, 5% Si | 5% |
| J | 80% Cu, 15% B, 5% Si | 33% |
| K | 80% Cu, 15% B, 3% Al, 2% Si | — |
| L | 80% Cu, 15% B, 3% Al, 2% Si | 33% |

The results of the resistivity test are set forth in Table V below showing the resistivity of inks which had been fired at various temperatures:

TABLE V

| Ink | Peak Firing Temp. °C. | Fired Thickness | Resistivity | Scratch Strength |
|---|---|---|---|---|
| A | 600 (X2) | — | $\infty^a$ | 3 |
|   | 700 (X2) | — | $\infty^a$ | 5 |
|   | 850 (X2) | — | $\infty^a$ | 5 |
| B | 650 (X2) | — | $\infty$ | 4 |
|   | 750 (X2) | — | $\infty$ | 6 |
|   | 850 (X2) | — | $\infty$ | 8 |

TABLE V-continued

| Ink | Peak Firing Temp. °C. | Fired Thickness | Resistivity | Scratch Strength |
|---|---|---|---|---|
| C | 600 | .006 | .014 | 9 |
|   | 600 | .006 | .012 | 9 |
|   | 700 | .006 | .012 | 9 |
|   | 700 | .006 | .011 | 9 |
|   | 850 | .006 | ∞[b] | 9 |
|   | 850 | .006 | ∞[b] | 9 |
| D | 600 | .006 | .008 | 9 |
|   | 600 | .006 | .011 | 9 |
|   | 700 | .006 | .009 | 9 |
|   | 700 | .006 | .013 | 9 |
|   | 850 | .006 | ∞[b] | 9 |
|   | 850 | .006 | ∞[b] | 9 |
| E | 600 | .008 | .061 | 8 |
|   | 600 | .008 | .044 | 8 |
|   | 700 | .006 | .036 | 9 |
|   | 700 | .006 | .033 | 9 |
|   | 850 | .007 | ∞ | 9 |
|   | 850 | .007 | ∞ | 9 |
| F | 600 (2) |  | ∞ | 6 |
|   | 700 (2) |  | ∞ | 9 |
|   | 850 (2) |  | ∞ | 9 |
| G | 600 (2) |  | ∞ | 6 |
|   | 700 (2) |  | ∞ | 9 |
|   | 850 (2) |  | ∞ | 9 |
| H | 600 (2) | — | ∞ | 7 |
|   | 700 | .015 | 2.85 | 8 |
|   | 700 | .015 | 3.03 | 8 |
|   | 850 | .015 | .973 | 8 |
|   | 850 | — | ∞ | 8 |
| I | 600 (2) | — | ∞ | 8 |
|   | 700 | .007 | 5.91 | 8 |
|   | 700 | .007 | 10.5 | 8 |
|   | 850 | .006 | .592 | 8 |
|   | 850 | .008 | 6.14 | 8 |
| J | 600 (2) | — | ∞ | 7 |
|   | 700 | .007 | .532 | 9 |
|   | 700 | .007 | .519 | 9 |
|   | 850 | .006 | .057 | 9 |
|   | 850 | .008 | .029 | 9 |
|   | 900 | .008 | .025 | 9 |
|   | 900 | .007 | .022 | 9 |
| K | 600 (2) | — | ∞ | 7 |
|   | 700 (2) | — | ∞ | 8 |
|   | 850 (2) | — | ∞ | 9 |
| L | 850 | .008 | 2.25[c] | 9 |
|   | 850 | .008 | 1.98[c] | 9 |
|   | 900 | .006 | .93[c] | 9 |
|   | 900 | .008 | .76[c] | 9 |

[a]Black-heavily oxidized
[b]Green-heavily oxidized
[c]Very metallic-brass color It is evident from the above table that inks which do not contain lead or lead oxide exhibit relatively poor conductivity, in some instances being infinite, than do inks which contain a percentage of lead or lead oxide. While it is noted that the scratch strength may, in some instances, exhibit relatively good numbers, the susceptibility to greater erosion was present, thus contributing to deterioration and aversion to the utilization of said inks in equipment which is exposed to possible moisture or water.

We claim as our invention:

1. A conductive, water-resistant, pigment-coated surface wherein the coating comprises an alloy of a non-noble conductive metal and at least one oxidizable material in admixture with a lead alloy.

2. The conductive water-resistant, pigment-coated surface as set forth in claim 1 in which said oxidizable material is present in said alloy in an amount in the range of from about 5% to about 20% by weight of said alloy.

3. The conductive water-resistant, pigment-coated surface as set forth in claim 1 in which said nonnoble conductive metal is nickel.

4. The conductive water-resistant, pigment-coated surface as set forth in claim 1 in which said nonnoble conductive metal is copper.

5. The conductive water-resistant, pigment-coated surface as set forth in claim 1 in which said lead alloy is present in said admixture in an amount in the range of from about 0.5 to about 10 times the amount of oxidizable material present in the alloy of nonnoble metal and oxidizable material.

6. The conductive water-resistant, pigment-coated surface as set forth in claim 1 in which said lead alloy is a lead-copper alloy.

7. The conductive water-resistant, pigment-coated surface as set forth in claim 1 in which said oxidizable material is selected from the group consisting of carbon, boron, boron-carbon and boron-silicon.

8. The conductive water-resistant, pigment-coated surface as set forth in claim 7 in which said oxidizable material is boron.

9. The conductive water-resistant, pigment-coated surface as set forth in claim 7 in which said oxidizable material is carbon.

10. A process for the preparation of a conductive water-resistant, pigment-coated surface which comprises alloying a non-noble conductive metal with at least one oxidizable material, admixing the thus-formed alloy with a lead alloy, mixing the resultant admixture with an organic vehicle to form an ink, screening said ink onto a substrate, thereafter firing said ink in an oxidizing atmosphere at a temperature in excess of about 1000° F. for a period of time sufficient to oxidize said oxidizable material with oxidation of said non-noble metal, cooling the thus-fired product, and recovering the resultant conductive water-resistant, pigment-coated surface.

11. The process as set forth in claim 10 in which said oxidizable material is selected from the group consisting of carbon, boron, boron-carbon, and boron-silicon.

12. The process as set forth in claim 10 in which said oxidizable material is present in said alloy in an amount in the range of from about 5% to about 20% by weight of said alloy.

13. The process as set forth in claim 10 in which said oxidizable material is boron.

14. The process as set forth in claim 10 in which said oxidizable material is copper.

15. The process as set forth in claim 10 in which said nonnoble conductive metal is nickel.

16. The process as set forth in claim 10 in which said nonnoble metal is copper.

17. The process as set forth in claim 10 in which said lead-alloy is present in said admixture in an amount in the range of from about 0.5 to about 10 times amount of oxidizable material present in the alloy of nonnoble metal and oxidizable material.

18. The process as set forth in claim 10 in which said lead alloy is a lead-copper alloy.

* * * * *